United States Patent [19]

Liu

[11] Patent Number: 5,629,235
[45] Date of Patent: May 13, 1997

[54] METHOD FOR FORMING DAMAGE-FREE BURIED CONTACT

[75] Inventor: Min-Sea Liu, Hsin-Chu, Taiwan

[73] Assignee: Winbond Electronics Corporation, Hsin-Chu, Taiwan

[21] Appl. No.: 498,153

[22] Filed: Jul. 5, 1995

[51] Int. Cl.$^6$ ................................................ H01L 21/44
[52] U.S. Cl. ........................... 438/533; 438/702; 438/714; 438/233
[58] Field of Search ........................... 437/186, 191, 437/192, 193

[56] References Cited

U.S. PATENT DOCUMENTS

| | | | |
|---|---|---|---|
| 4,098,917 | 7/1978 | Bullock et al. | 427/36 |
| 4,341,009 | 7/1982 | Barthalomew et al. | 437/191 |
| 4,397,076 | 8/1983 | Honnigford et al. | |
| 4,829,024 | 5/1989 | Klien et al. | 437/189 |
| 4,830,972 | 5/1989 | Hamasaki | 437/191 |
| 4,894,693 | 1/1990 | Tigelaar | |
| 4,950,620 | 8/1990 | Harrington III | 437/60 |
| 5,162,259 | 11/1992 | Kolar et al. | 437/192 |
| 5,169,487 | 12/1992 | Langley et al. | 156/643.1 |
| 5,266,519 | 11/1993 | Iwamoto | 437/183 |
| 5,308,795 | 5/1994 | Hawley et al. | 437/195 |
| 5,340,774 | 8/1994 | Yen | 437/240 |
| 5,410,174 | 4/1995 | Kalnitsky | 257/384 |
| 5,453,400 | 9/1995 | Abernathey et al. | 437/192 |

OTHER PUBLICATIONS

Stanley Wolf, et al. "Silicon Processing for the VLSI Era: vol. I" Lattice Press, Calif. (1986) pp. 518–519 and 532–533, and p. 420.

*Primary Examiner*—John Niebling
*Assistant Examiner*—C. Everhart

[57] ABSTRACT

The present invention is related to a method for forming a damage-free buried contact. The method according to the present invention includes steps of a) providing a silicon substrate; b) forming an oxide layer on the silicon substrate; c) forming a first conductive layer on the oxide layer; d) defining a buried contact region on the first conductive layer on the first conductive layer; e) removing a portion of the first conductive layer according to a shape of the buried contact region; f) implanting ions in the buried contact region to form an ion-implantation region under the oxide layer; and f) removing a portion of the oxide layer to obtain the buried contact. The step f) can be executed either before or after the step f). The present invention provides a method for forming a buried contact by which trench will not be occurred on the silicon substrate during the etching process thereof, so that a damage-free buried contact can be obtained.

38 Claims, 10 Drawing Sheets

METHOD FOR FORMING DAMAGE-FREE BURIED CONTACT

FIELD OF THE INVENTION

The present invention is related to a method for forming a buried contact, and more particularly to a method for forming a damage-free buried contact.

BACKGROUND OF THE INVENTION

The use of buried contact in integrated circuit is principally for the connection between polysilicon and the $N^+$ region of silicon substrate. The buried contact is particularly popular for the CMOS SRAM manufacturing process. The conventional process involving the fabrication of buried contact is shown in FIGS. 1~4 and the relevant descriptions are as follows.

The steps for forming buried contact are shown in FIGS. 1~4 and inclusive of:

1) forming an oxide layer 2 on a p-type silicon substrate 1;
2) depositing a first polysilicon layer 3 on the oxide layer 2 for protecting the oxide layer 2 which serves as a gate dielectric layer from environmental contamination;
3) applying a photoresist mask 4 onto the first polysilicon layer 3, and defining a buried contact region by way of photolithography; and
4) etching a portion of the first polysilicon layer 3 and the gate oxide layer 2 according to the shape of the photoresist mask 4 to form buried contact.

Figure 1:
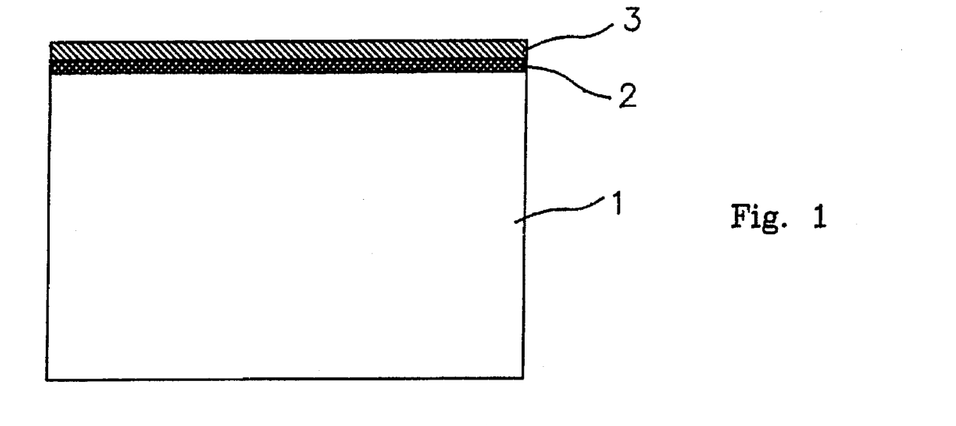
FIGS. 1~4 are elevational cross-section views schematically showing the resulting layers formed by a conventional process involving the fabrication of buried contact.
Figure 2:
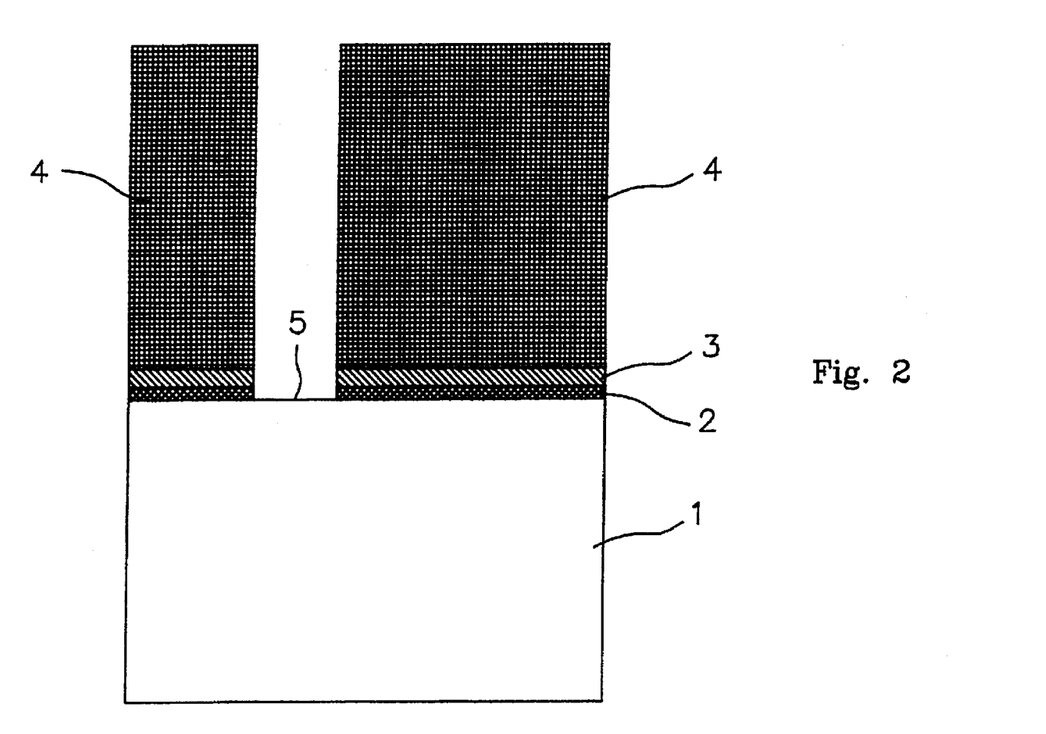
Figure 3:
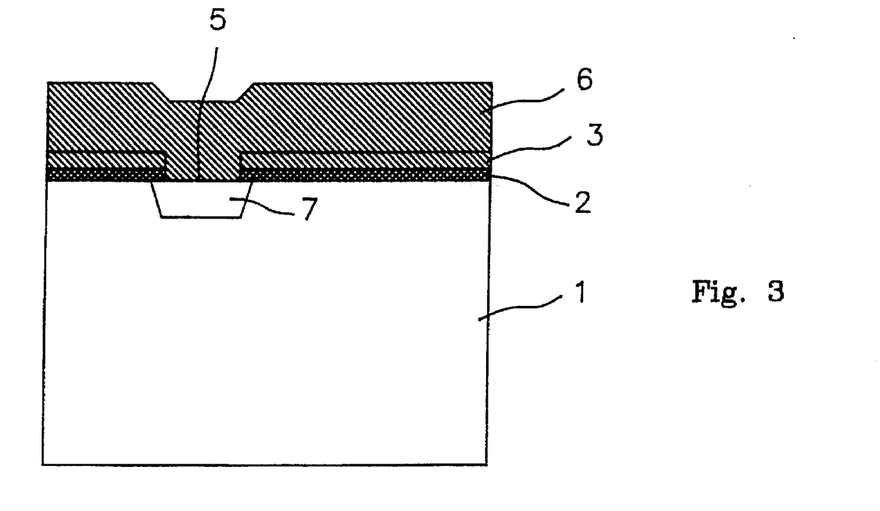
Figure 4:
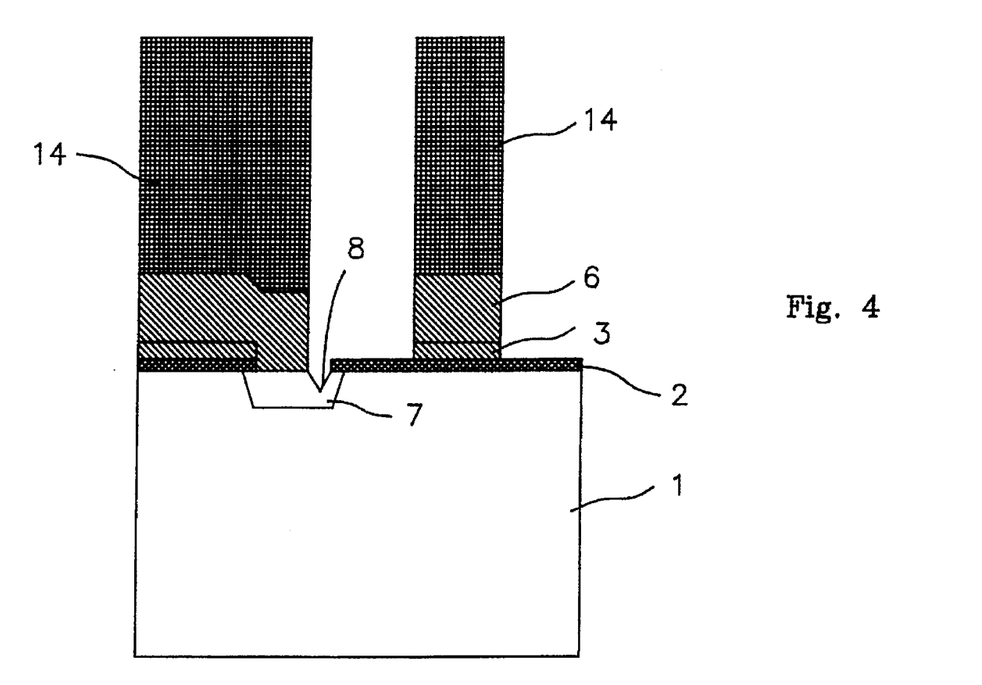
Figure 5:
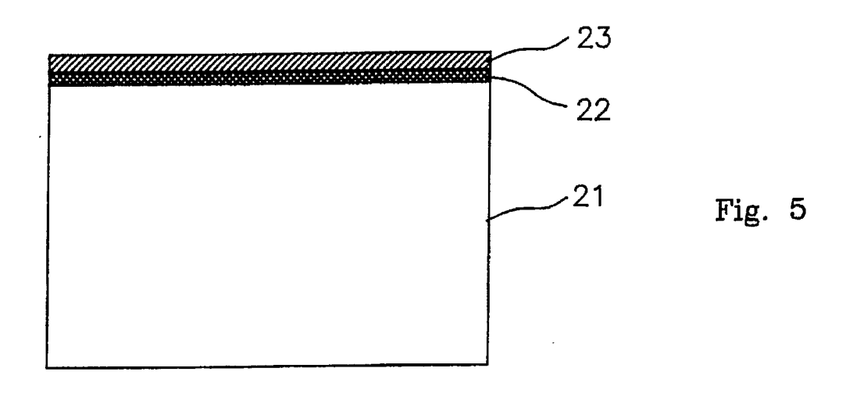
FIGS. 5~12 are elevational cross-section views schematically showing the resulting layers formed by a first preferred embodiment of a construction process involving the fabrication of buried contact according to the present invention.
Figure 6:
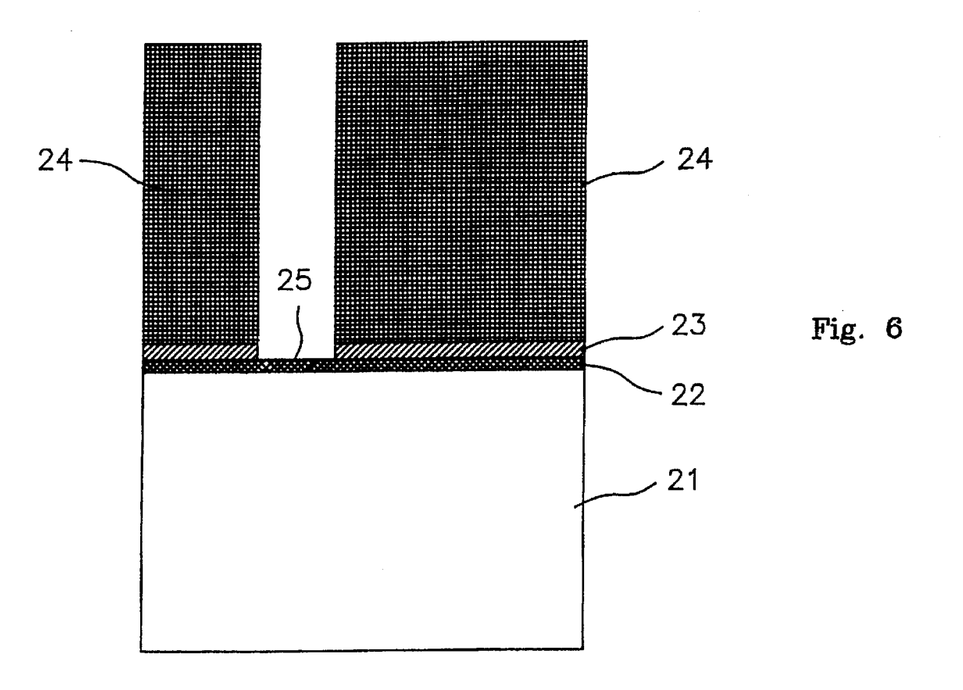
Figure 7:
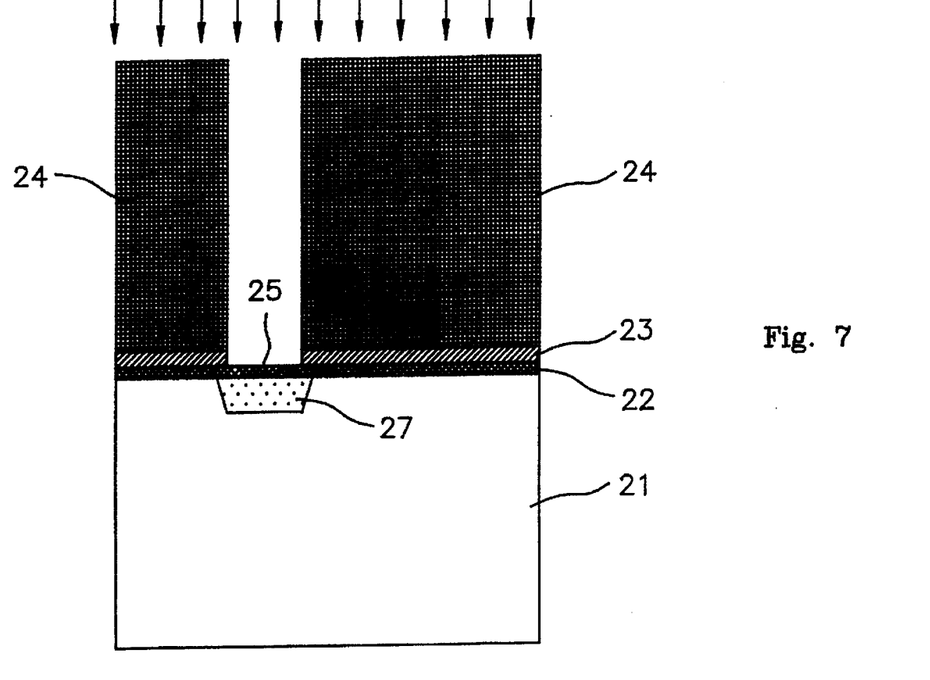
Figure 8:
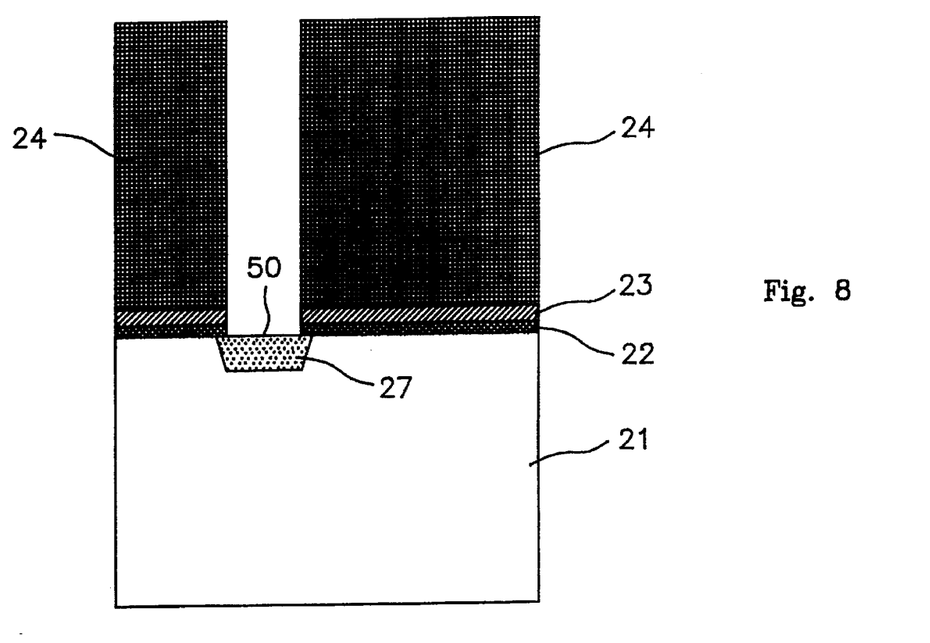
Figure 9:
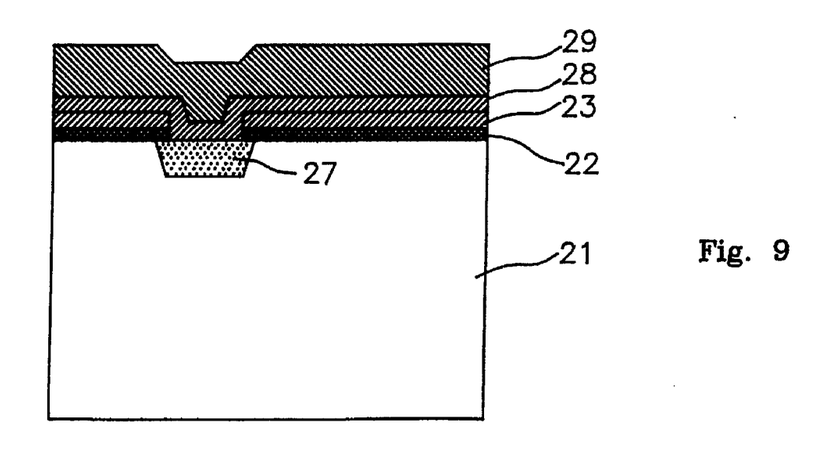
Figure 10:
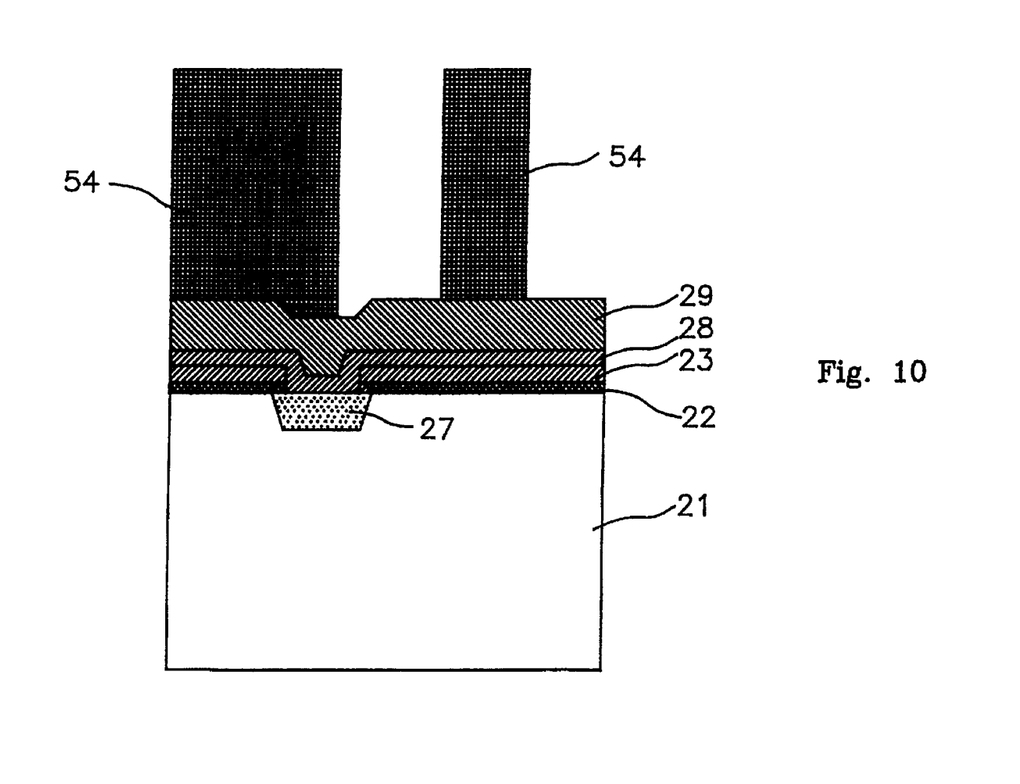
Figure 11:
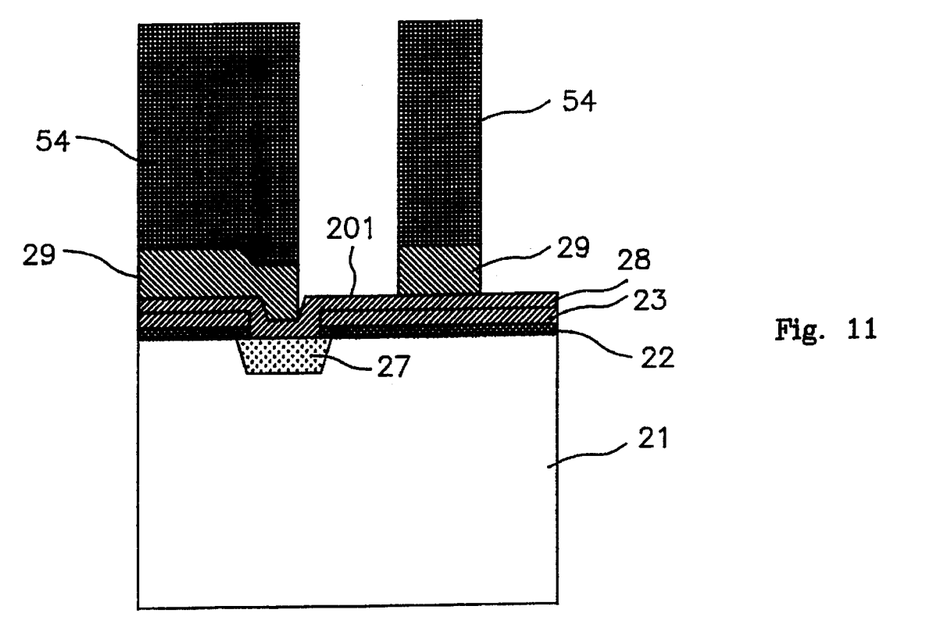
Figure 12:
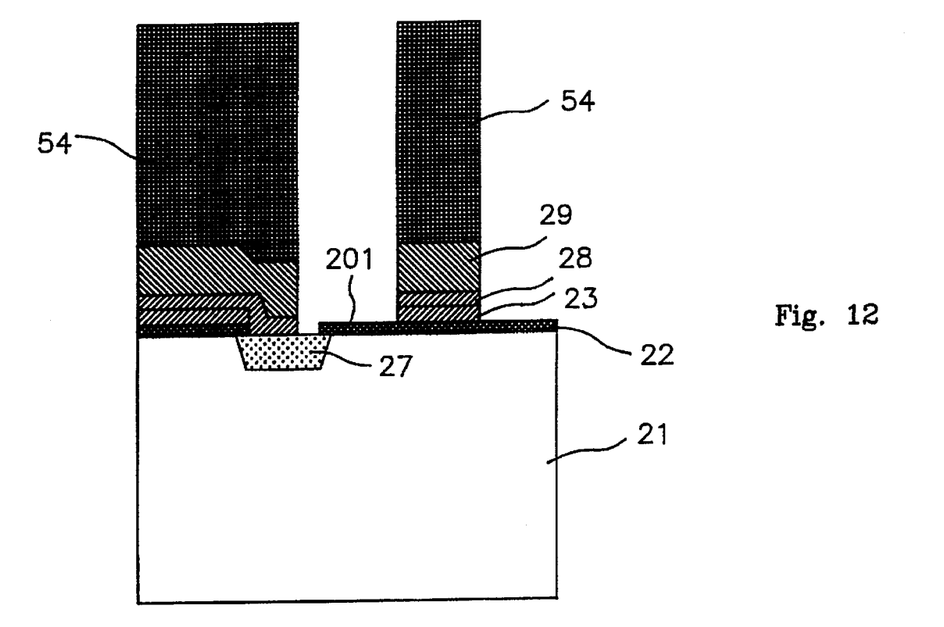
Figure 13:
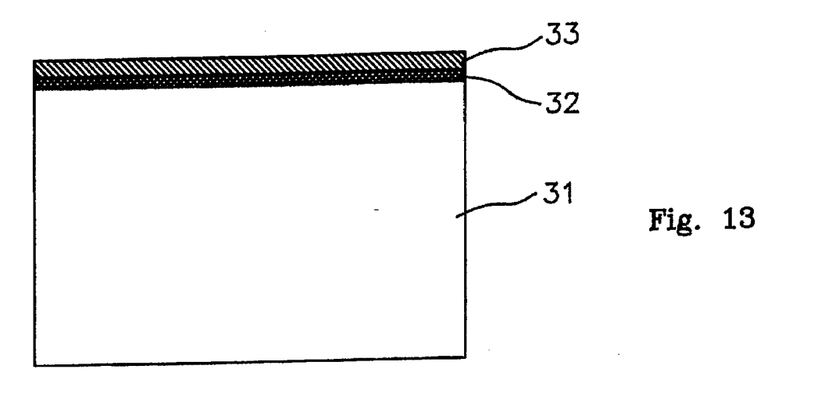
FIGS. 13~20 are elevational cross-section views schematically showing the resulting layers formed by a second preferred embodiment of a construction process involving the fabrication of buried contact according to the present invention.
Figure 14:
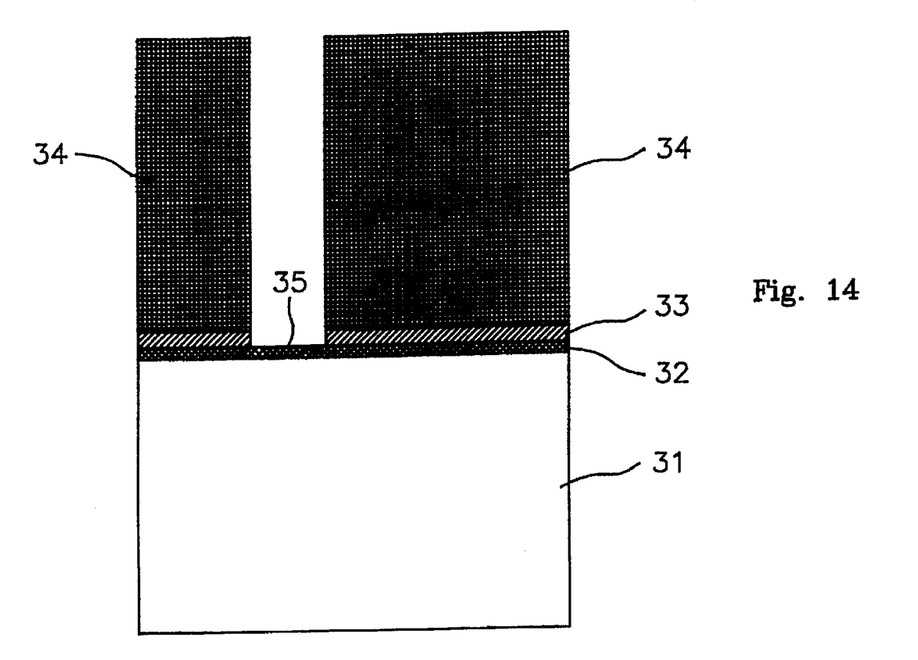
Figure 15:
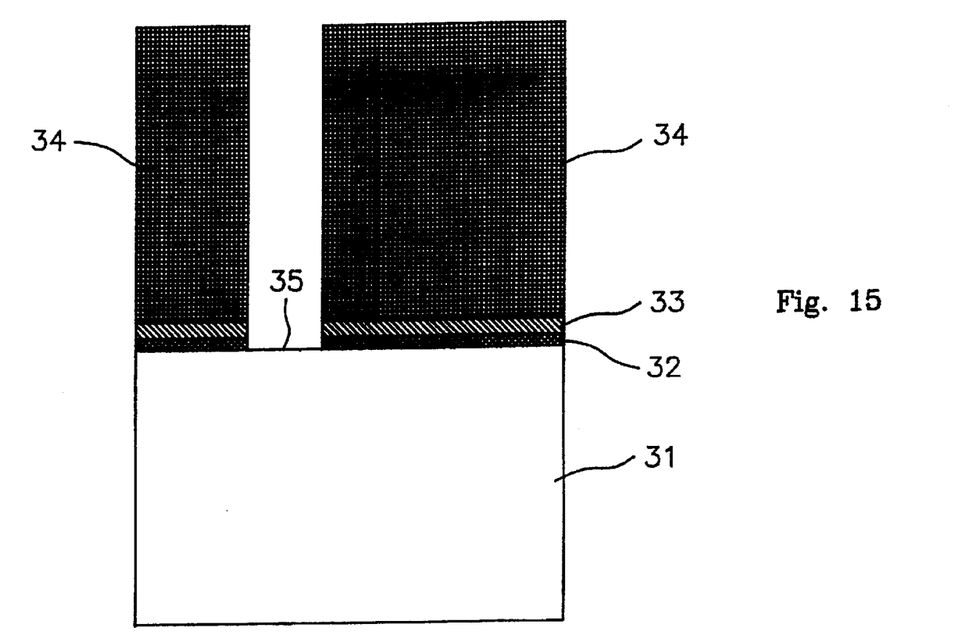
Figure 16:
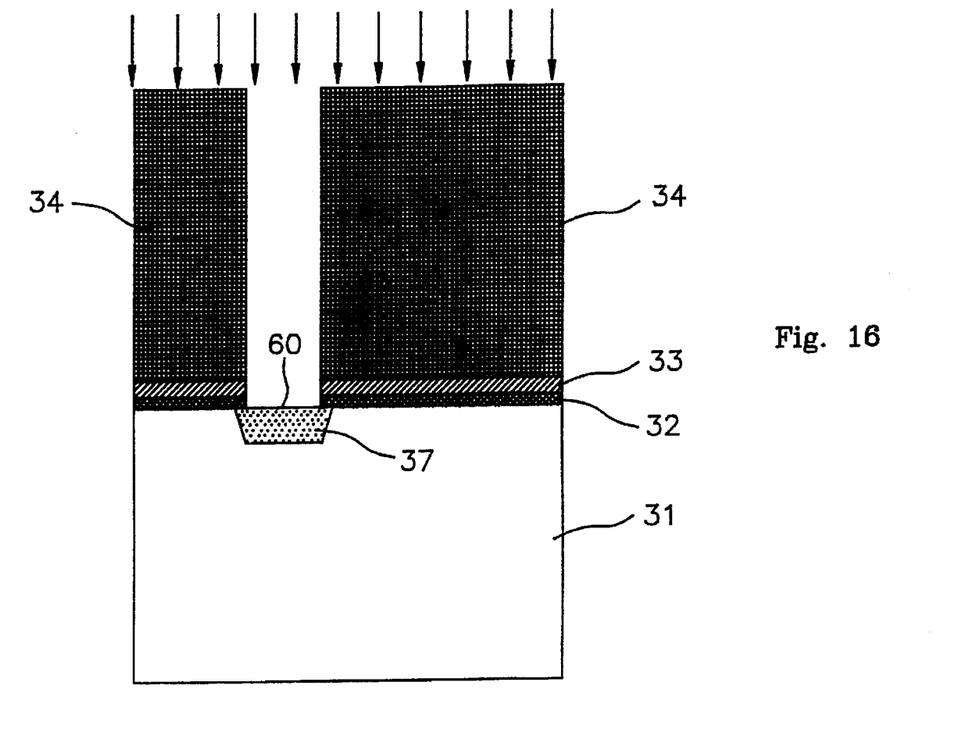
Figure 17:
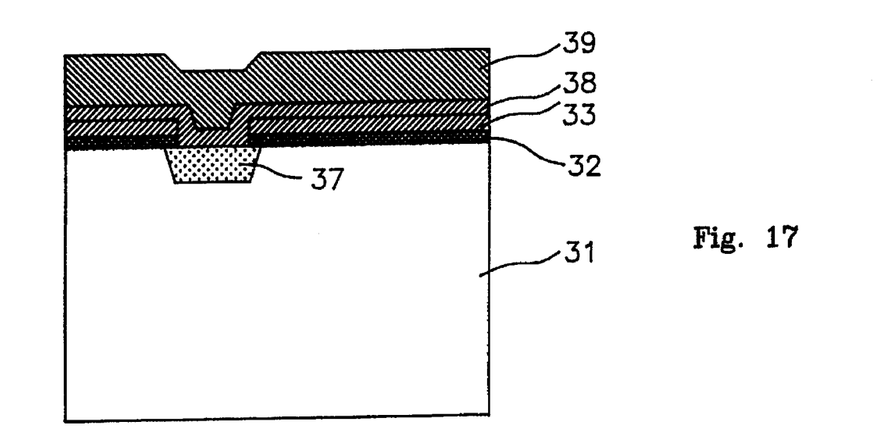
Figure 18:
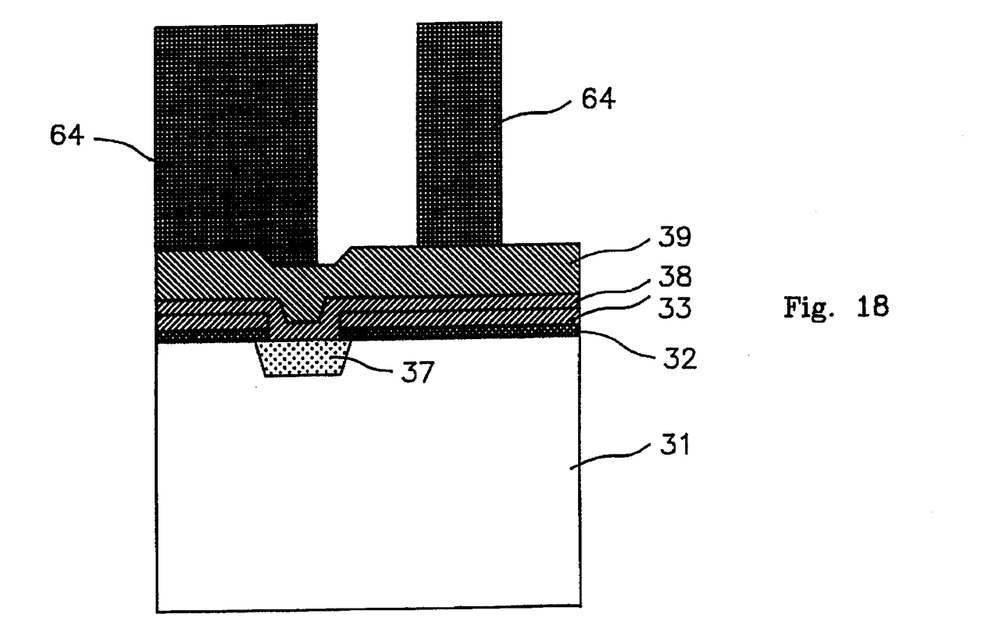
Figure 19:
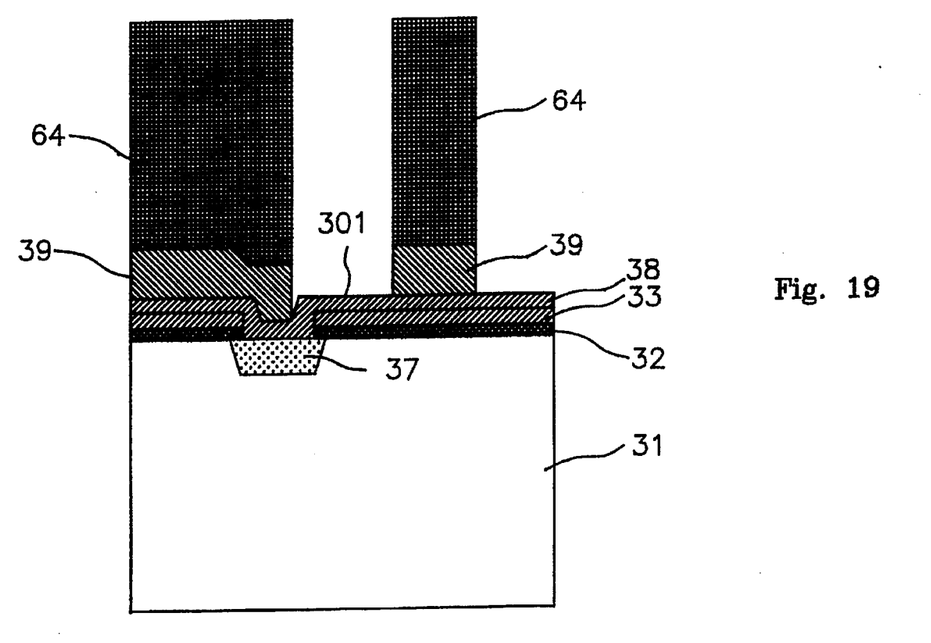
Figure 20:
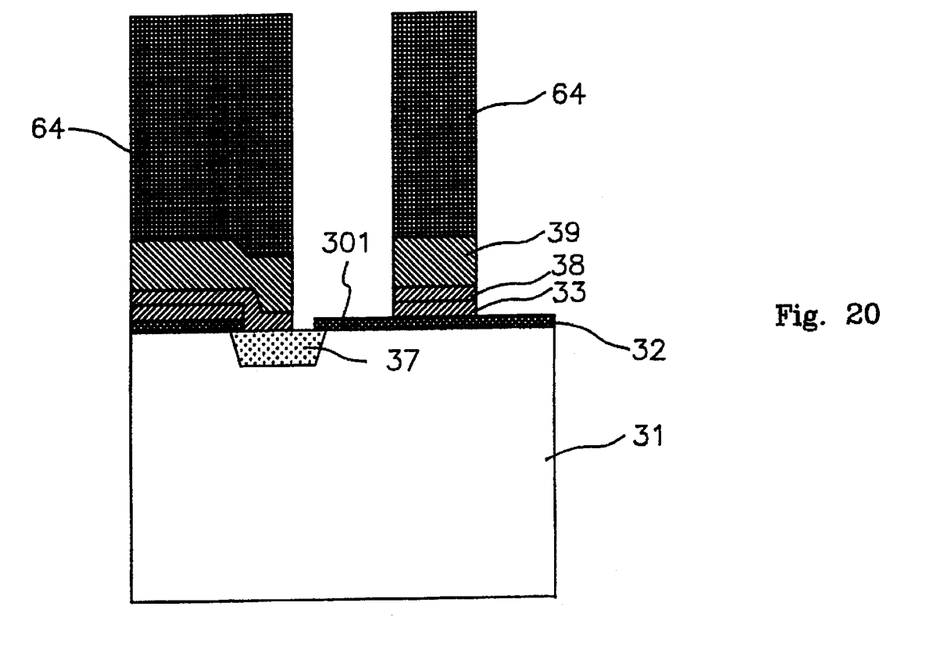

After the buried contact is obtained, the photoresist mask 4 is removed, and a second polysilicon layer 6 is deposited on the buried contact 5 and the unetched portion of the first polysilicon layer 3, as shown in FIG. 3. The resistance of the first and the second polysilicon layers 3 and 6 can be reduced by a diffusion process which is executed in a high temperature furnace and utilizes $POCl_3$ as gas source. Meanwhile, an $N^+$ region 7 is formed in the silicon substrate under the buried contact 5. Referring to FIG. 4, another photoresist mask 14 is formed on the surface of the second polysilicon layer 6, and the desired source/drain region can be defined by photolithography technique. Then, the source/drain region can be obtained by plasma etching the second and the first polysilicon layers 6 and 3.

Because the etching selectivity of the polysilicon over the silicon substrate is about 1:1, the silicon substrate 1 will be etched at the same rate as that of the etching process for etching polysilicon layers 6 and 3, and thus a trench 8 will possibly be formed. The existence of the trench 8 may provide a current-leakage path between the $N^+$ region 7 and the silicon substrate 1 so that the property of the device is adversely affected.

SUMMARY OF THE INVENTION

An object of the present invention is to provide a method for forming a buried contact by which a trench will not form on the silicon substrate during the etching process thereof, so that a damage-free buried contact can be obtained.

In accordance with the present invention, a method for forming a damage-free buried contact includes steps of: a) providing a silicon substrate; b) forming an oxide layer on the silicon substrate; c) forming a first conductive layer on the oxide layer; d) defining a buried contact region on the first conductive layer; e) removing a portion of the first conductive layer according to a shape of the buried contact region; f) implanting ions in the buried contact region to form an ion-implantation region under the oxide layer; and f) removing a portion of the oxide layer to obtain the buried contact. The step f) can be executed before or after the step f).

In accordance with another aspect of the present invention, if the step f) is executed before the step f), and the ions implanted to the buried contact region in the step f) are phosphoric ions, an energy for ion implantation is preferably ranged from 30 to 80 KeV and a dosage for ion implantation is preferably ranged from $1\times10^{15}$ to $8\times10^{15}$ atom/cm$^2$. If the ions implanted to the buried contact region in the step f) are arsenic ions, an energy for ion implantation is preferably ranged from 50 to 100 KeV and a dosage for ion implantation is preferably ranged from $1\times10^{15}$ to $7\times10^{15}$ atom/cm$^2$.

In accordance with another aspect of the present invention, if the step f) is executed after the step f) and the ions implanted to the buried contact region in the step f) are phosphoric ions, an energy for ion implantation is preferably ranged from 5 to 70 KeV and a dosage for ion implantation is ranged from $1\times10^{15}$ to $8\times10^{15}$ atom/cm$^2$. If the ions implanted to the buried contact region in the step f) are arsenic ions, an energy for ion implantation is preferably ranged from 5 to 80 KeV and a dosage for ion implantation is preferably ranged from $1\times10^{15}$ to $7\times10^{15}$ atom/cm$^2$.

In accordance with another aspect of the present invention, the step f) can be executed by an anisotropic plasma-etching technique in which $CCl_2F_2$, a mixture of $CHF_3$ and $CF_4$, a mixture of $CHF_3$ and $O_2$, or $CH_3CHF_2$ can serve as an etching gas, or by applying thereto a HF aqueous solution or an aqueous mixture of HF and buffering agent in which the buffering agent is preferably $NH_4F$.

In accordance with another aspect of the present invention, the silicon substrate can be a p-type substrate or an n-type substrate with a p-well in which buried contact region is above the p-well.

In accordance with another aspect of the present invention, the oxide layer can be formed by thermal oxidization or chemical vapor deposition (CVD), and a thickness thereof is about 70~180Å.

In accordance with another aspect of the present invention, the first conductive layer can be formed by a technique of sputtering deposition or chemical vapor deposition.

In accordance with another aspect of the present invention, the step d) is executed by a photolithography technique which forms a photoresist mask on the first conductive layer to define the buried contact region, and a thickness of the photoresist mask is preferably ranged from 7000Å~20000Å.

In accordance with another aspect of the present invention, the present method preferably further includes a step g) of removing the photoresist layer by oxygen plasma etching, $H_2SO_4$ and $H_2O_2$ erosion, phenol-based agent stripping, or phenol-free organic agent stripping after the buried contact is obtained.

In accordance with another aspect of the present invention, the step e) is executed by an anisotropic plasma-etching technique, and when the first conductive layer is a titanium nitride layer, an etching gas used in the step e) is a mixture of Ar and $Cl_2$. When the first conductive layer is a titanium tungsten layer, an etching gas used in the step e) can be a mixture of $SF_6$ and Ar or a mixture of $SF_6$ and $N_2$. The first conductive layer preferably has a thickness of about 500~1000Å.

In accordance with another aspect of the present invention, the ions implanted to the buried contact region in the step f) can be phosphoric ions, an energy for ion implantation is preferably ranged from 30 to 80 KeV, and a dosage for ion implantation is preferably ranged from $1\times10^{15}$ to $8\times10^{15}$ atom/cm$^2$. The ions implanted to the buried contact region in the step f) also can be arsenic ions, an energy for ion implantation is ranged from 50 to 100 KeV, and a dosage for ion implantation is ranged from $1\times10^{15}$ to $7\times10^{15}$ atom/cm$^2$.

In accordance with another aspect of the present invention, the present method preferably further includes after the step f) a step of proceeding thermal cycle annealing at a temperature equal to or greater than 800° C. at least once.

In accordance with another aspect of the present invention, the resulting layers can be further processed by steps of: h) forming a second conductive layer on the buried contact and the first conductive layer; i) forming a polysilicon layer on the second conductive layer; j) defining a drain/source reserve region; and k) removing portions of the polysilicon layer and the first and the second conductive layers according to a shape of the drain/source reserve region to form a source/drain region.

In accordance with another aspect of the present invention, the step h) is executed by sputtering deposition or chemical vapor deposition.

In accordance with another aspect of the present invention, the second conductive layer can be a titanium nitride layer or a titanium tungsten layer, and a thickness thereof is about 500~1500Å.

In accordance with another aspect of the present invention, the polysilicon layer is formed by a CVD technique at 600°~700° C., and a thickness thereof is about 1500~4000Å.

In accordance with another aspect of the present invention, the present method preferably further includes after the step i) a diffusion step of POCl$_3$ gas at 800°~1100° C. to reduce a resistance of the polysilicon layer.

In accordance with another aspect of the present invention, the step j) is executed by a photolithography technique.

In accordance with another aspect of the present invention, the step k) preferably includes procedures of: 1) using a first etching gas having a relatively high etching rate to the polysilicon layer and a relatively low etching rate to the second conductive layer to anisotropically etch off the portion in the polysilicon layer of the drain/source reserve region; and m) using a second etching gas having a relatively high etching rate to the first and the second conductive layers and a relatively low etching rate to the oxide layer and the silicon substrate to anisotropically etch off the portions of the first and the second conductive layers in the drain/source reserve region. The first etching gas can be a mixture of SiCl$_3$ and Cl$_2$, a mixture of BCl$_3$ and Cl$_2$, a mixture of HBr, Cl$_2$ and O$_2$, a mixture of HBr and O$_2$, a mixture of Br$_2$ and O$_2$, a mixture of Br$_2$ and SF$_6$ or a mixture of SF$_6$ and 25% O$_2$. The second etching gas is a mixture of Ar and Cl$_2$ when the first and the second conductive layers are titanium nitride layers, and the second etching gas can be a mixture of SF$_6$ and Ar or a mixture of SF$_6$ and N$_2$ when the first and the second conductive layers are titanium tungsten layers.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In accordance with the present invention, a method for forming a damage-free buried contact is shown in FIGS. 5~8 and includes steps of:

1) providing a p-type silicon substrate 21;
2) forming an oxide layer 22 of about 70~180Å on the silicon substrate 21, wherein the oxide layer 22 can be formed by thermal oxidization or chemical vapor deposition (CVD);
3) forming a first conductive layer 23 of about 500~1000Å on the oxide layer 22 by sputtering deposition or CVD technique to protect the oxide layer 22 serving as a gate dielectric layer from being contaminated;
4) applying a 7000–20,000Å layer of photoresist mask 24 on the first conductive layer 23 for defining a buried contact region 25 by photolithography technique;
5) removing a portion of the first conductive layer 23 according to the shape of the buried contact region 25 by anisotropic plasma-etching, wherein the etching gas is SF$_6$/Ar or SF$_6$/N$_2$ if the first conductive layer 23 is a layer of titanium tungsten, and the etching gas is Ar/Cl$_2$ if the first conductive layer 23 is a layer of titanium nitride;
6) implanting ions in the buried contact region 25 to form an N$^+$ region 27 under the oxide layer 22, wherein the energy for ion implantation is preferably ranged from 30 to 80 KeV and the dosage for ion implantation is preferably ranged from $1\times10^{15}$ to $8\times10^{15}$ atom/cm$^2$ if the ions are phosphoric ions, and the energy for ion implantation is preferably ranged from 50 to 100 KeV and the dosage for ion implantation is preferably ranged from $1\times10^{15}$ to $7\times10^{15}$ atom/cm$^2$ if the ions are arsenic ions;
7) proceeding thermal cycle annealing at a temperature equal to or greater than 800° C. at least once; and
8) removing a portion of the oxide layer 22 on the N$^+$ region 27 by anisotropic plasma-etching with CHF$_3$/O$_2$, CCl$_2$F$_2$, CHF$_3$/CF$_4$ or CH$_3$CHF$_2$ to obtain a buried contact 50.

Of course, a step of removing the photoresist layer 24 by oxygen plasma etching, H$_2$SO$_4$ and H$_2$O$_2$ erosion, phenol-based agent stripping, or phenol-free organic agent stripping can be executed after the buried contact 50 is obtained. The resulting layers can be further processed by the following steps, and the layers formed during the procedures are shown in FIGS. 9~12:

9) forming a second conductive layer 28 of about 500~1500Å on the buried contact 50 and the first conductive layer 23 by way of sputtering or CVD technique, wherein the second conductive layer 28 can be a titanium nitride layer or a titanium tungsten layer;

10) forming a polysilicon layer 29 of about 1500~4000Å on the second conductive layer 28 by CVD technique at a temperature ranged from 600° C. to 700° C.;

11) using $POCl_3$ gas as a gas source to proceed a diffusing step at 800°~1100° C. to reduce the resistance of the polysilicon layer 29;

12) defining a drain/source reserve region by applying a 7000–20,000Å layer of photoresist mask 54 on the second conductive layer 28 by photolithography technique; and 13) removing portions of the polysilicon layer 29 and the first and the second conductive layers 23 and 28 according to the shape of the drain/source reserve region to form a source/drain region 201. The portion of the polysilicon layer 29 is removed by anisotropic etching which uses a first etching gas having a relatively high etching rate to the polysilicon layer 29 and a relatively low etching rate to the second conductive layer 28, and the portions of the first and the second conductive layers 23 and 28 are anisotropically etched by using a second etching gas having a relatively high etching rate to the first and the second conductive layers 23 and 28 and a relatively low etching rate to the oxide layer 22 and the silicon substrate 21, wherein the first etching gas can be $SiCl_3/Cl_2$, $BCl_3/Cl_2$, $HBr/Cl_2/O_2$, $HBr/O_2$, $Br_2/O_2$, $Br_2/SF_6$ or $SF_6/25\%$ $O_2$, and the second etching gas is $Ar/Cl_2$ when the first and the second conductive layers 23 and 28 are titanium nitride layers and can be $SF_6/Ar$ or $SF_6/N_2$ when the first and the second conductive layers 23 and 28 are titanium tungsten layers.

In an alternative preferred embodiment, the portion of the oxide layer 22 on the $N^+$ region 27 can also be removed by using a HF aqueous solution or a HF/buffering-agent aqueous solution to obtain the buried contact 50, wherein the buffering agent is preferably $NH_4F$. In addition, the thermal cycle annealing procedure can be proceeded at any time after the ion-implantation step and before the wafer is performed.

Another preferred embodiment will be described as follows with reference to FIGS. 13–20.

1) providing a silicon substrate 31;

2) forming an oxide layer 32 of about 70~180Å on the silicon substrate 31, wherein the oxide layer 32 can be formed by thermal oxidization or chemical vapor deposition (CVD);

3) forming a first conductive layer 33 of about 500~1000Å on the oxide layer 32 by sputtering deposition or CVD technique to protect the oxide layer 32 serving as a gate dielectric layer from being contaminated;

4) applying a 7000–20,000Å layer of photoresist mask 34 on the first conductive layer 33 for defining a buried contact region 35 by photolithography technique;

5) removing a portion of the first conductive layer 33 according to the shape of the buried contact region 35 by anisotropic plasma-etching, wherein the etching gas is $SF_6/Ar$ or $SF_6/N_2$ if the first conductive layer 33 is a layer of titanium tungsten, and the etching gas is $Ar/Cl_2$ if the first conductive layer 33 is a layer of titanium nitride;

6) removing a port/on of the oxide layer 32 by applying thereto a HF aqueous solution or a HF/buffering-agent aqueous solution to obtain a buried contact 60, wherein the buffering agent is preferably $NH_4F$.

7) implanting ions in the buried contact region 35 to form an $N^+$ region 37 under the oxide layer 32, wherein the energy for ion implantation is preferably ranged from 5 to 70 KeV and the dosage for ion implantation is preferably ranged from $1\times10^{15}$ to $8\times10^{15}$ atom/cm² if the ions are phosphoric ions, and the energy for ion implantation is preferably ranged from 5 to 80 KeV and the dosage for ion implantation is preferably ranged from $1\times10^{15}$ to $7\times10^{15}$ atom/cm² if the ions are arsenic ions;

8) proceeding thermal cycle annealing at a temperature equal to or greater than 800° C. at least once;

9) removing the photoresist layer 34 by oxygen plasma etching, $H_2SO_4$ and $H_2O_2$ erosion, phenol-based agent stripping, or phenol-free organic agent stripping after the buried contact 60 is obtained, and forming a second conductive layer 38 of about 500~1500Å on the buried contact 50 and the first conductive layer 33 by way of sputtering or CVD technique, wherein the second conductive layer 38 can be a titanium nitride layer or a titanium tungsten layer;

10) forming a polysilicon layer 39 of about 1500~4000Å on the second conductive layer 38 by CVD technique at a temperature ranged from 600° C. to 700° C.;

11) using $POCl_3$ gas as a gas source to proceed a diffusing step at 800°~1100° C. to reduce the resistance of the polysilicon layer 39;

12) defining a drain/source reserve region by applying a 7000–20,000Å layer of photoresist mask 64 on the second conductive layer 38 by photolithography technique; and 13) removing portions of the polysilicon layer 39 and the first and the second conductive layers 33 and 38 according to the shape of the drain/source reserve region to form a source/drain region 301. The portion of the polysilicon layer 39 is removed by anisotropic etching which uses a first etching gas having a relatively high etching rate to the polysilicon layer 39 and a relatively low etching rate to the second conductive layer 38, and the portions of the first and the second conductive layers 33 and 38 are anisotropically etched by using a second etching gas having a relatively high etching rate to the first and the second conductive layers 33 and 38 and a relatively low etching rate to the oxide layer 32 and the silicon substrate 31, wherein the first etching gas can be $SiCl_3/Cl_2$, $BCl_3/Cl_2$, $HBr/Cl_2/O_2$, $HBr/O_2$, $Br_2/O_2$, $Br_2/SF_6$ or $SF_6/25\%$ $O_2$, and the second etching gas is $Ar/Cl_2$ when the first and the second conductive layers 33 and 38 are titanium nitride layers and can be $SF_6/Ar$ or $SF_6/N_2$ when the first and the second conductive layers 33 and 38 are titanium tungsten layers.

In an alternative preferred embodiment, the portion of the oxide layer 32 on the $N^+$ region 37 can also be removed by anisotropic plasma-etching with $CHF_3/O_2$, $CCl_2F_2$, $CHF_3/CF_4$ or $CH_3CHF_2$ to obtain the buried contact 60. In addition, the thermal cycle annealing procedure can be proceeded at any time after the ion-implantation step and before the wafer is performed.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a damage-free buried contact, comprising the steps of:
   a) providing a silicon substrate;
   b) forming an oxide layer on said silicon substrate;
   c) forming a first conductive layer on said oxide layer;
   d) defining a buried contact region on said first conductive layer;
   e) removing a portion of said first conductive layer according to a shape of said buried contact region;
   f) implanting ions in said buried contact region to form an ion implantation region under said oxide layer;
   g) removing a portion of said oxide layer to obtain said buried contact;
   h) forming a second conductive layer on said buried contact and said first conductive layer;
   i) forming a polysilicon layer on said second conductive layer;
   j) defining a drain/source reserve region; and
   k) removing portions of said polysilicon layer and said first and second conductive layers selectively against said silicon substrate according to a shape of said drain/source reserve region to form a source/drain region.

2. A method according to claim 1 wherein said step f) is executed before said step g).

3. A method according to claim 2 wherein said ions implanted in said buried contact region in said step f) are phosphoric ions.

4. A method according to claim 3 wherein an energy for ion implantation is ranged from 30 to 80 KeV and a dosage for ion implantation is ranged from $1 \times 10^{15}$ to $8 \times 10^{15}$ atom/cm$^2$.

5. A method according to claim 2 wherein said ions implanted in said buried contact region in said step f) are arsenic ions.

6. A method according to claim 5 wherein an energy for ion implantation is ranged from 50 to 100 KeV and a dosage for ion implantation is ranged from $1 \times 10^{15}$ to $7 \times 10^{15}$ atom/cm$^2$.

7. A method according to claim 1 wherein said step g) is executed before said step f).

8. A method according to claim 7 wherein said ions implanted in said buried contact region in said step f) are phosphoric ions.

9. A method according to claim 8 wherein an energy for ion implantation is ranged from 5 to 70 KeV and a dosage for ion implantation is ranged from $1 \times 10^{15}$ to $8 \times 10^{15}$ atom/cm$^2$.

10. A method according to claim 7 wherein said ions implanted in said buried contact region in said step f) are arsenic ions.

11. A method according to claim 10 wherein an energy for ion implantation is ranged from 5 to 80 KeV and a dosage for ion implantation is ranged from $1 \times 10^{15}$ to $7 \times 10^{15}$ atom/cm$^2$.

12. A method according to claim 1 wherein said silicon substrate is a p-type substrate.

13. A method according to claim 1 wherein said silicon substrate is an n-type substrate with a p-well.

14. A method according to claim 13 wherein said buried contact region is above said p-well.

15. A method according to claim 1 wherein said oxide layer is formed by thermal oxidization and a thickness thereof is about 70~180Å.

16. A method according to claim 1 wherein said oxide layer is formed by chemical vapor deposition (CVD) and a thickness thereof is about 70~180Å.

17. A method according to claim 1 wherein said first conductive layer is formed by a technique selected from the group consisting of sputtering deposition and chemical vapor deposition.

18. A method according to claim 1 wherein said step d) is executed by a photolithography technique which forms a photoresist mask on said first conductive layer to define said buried contact region.

19. A method according to claim 18 wherein a thickness of said photoresist mask is ranged from 7000Å~20000Å.

20. A method according to claim 19 further comprising a step h) of removing said photoresist layer by a technique selected from the group consisting of oxygen plasma etching, $H_2SO_4$ and $H_2O_2$ erosion, phenol-based agent stripping, and phenol-free organic agent stripping after said buried contact is obtained.

21. A method according to claim 1 wherein said step e) is executed by an anisotropic plasma-etching technique.

22. A method according to claim 21 wherein said first conductive layer is a titanium nitride layer and a thickness thereof is about 500~1000Å.

23. A method according to claim 22 wherein an etching gas used in said step e) is a mixture of Ar and $Cl_2$.

24. A method according to claim 21 wherein said first conductive layer is a titanium tungsten layer and a thickness thereof is about 500~1000Å.

25. A method according to claim 24 wherein an etching gas used in said step e) is one selected from the group consisting of a mixture of $SF_6$ and Ar and a mixture of $SF_6$ and $N_2$.

26. A method according to claim 1 further comprising after said step f) a step of performing thermal cycle annealing at a temperature equal to or greater than 800° C. at least once.

27. A method according to claim 1 wherein said step g) is executed by an anisotropic plasma-etching technique.

28. A method according to claim 23 wherein said etching gas used in said step g) is one selected from the group consisting of $CCl_2F_2$, a mixture of $CHF_3$ and $CF_4$, a mixture of $CHF_3$ and $O_2$, and $CH_3CHF_2$.

29. A method according to claim 1 wherein said step g) is executed by applying thereto a solution selected from the group consisting of a HF aqueous solution and an aqueous mixture of HF and buffering agent.

30. A method according to claim 29 wherein said buffering agent is $NH_4F$.

31. A method according to claim 1 wherein said step i) is executed by a technique selected from the group consisting of sputtering deposition and chemical vapor deposition.

32. A method according to claim 1 wherein said second conductive layer is one selected from the group consisting of a titanium nitride layer and titanium tungsten layer, and a thickness thereof is about 5–1500Å.

33. A method according to claim 1 wherein said polysilicon layer is formed by a CVD technique at 600°–700° C., and a thickness thereof is about 1500–4000Å.

34. A method according to claim 1 further comprising after said step j) a diffusion step of $POCl_3$ gas at 800°–1100° C. to reduce a resistance of said polysilicon layer.

35. A method according to claim 1 wherein said step k) is executed by a photolithography technique.

36. A method according to claim 1 wherein said step l) further includes the steps of:

m) using a first etching gas having a relatively high etching rate to said polysilicon layer and a relatively low etching rate to said second conductive layer to anisotropically etch off said portion in said polysilicon layer of said drain/source reserve region; and n) using a second etching gas having a relatively high etching rate to said first and said second conductive layers and a relatively low etching rate to said oxide layer and said silicon substrate to anisotropically etch off said portions of said first and said second conductive layers in said drain/source reserve region.

37. A method according to claim 36 wherein said first etching gas is one selected from the group consisting of a mixture of $SiCl_3$ and $Cl_2$, a mixture of $BCl_3$ and $Cl_2$, a mixture of HBr, $Cl_2$ and $O_2$, a mixture of HBr and $O_2$, a mixture of $Br_2$ and $O_2$, a mixture of $Br_2$ and $SF_6$ and a mixture of $SF_6$ and 25% $O_2$.

38. A method according to claim 36 wherein said second etching gas is a mixture of Ar and $Cl_2$ when said first and said second conductive layers are titanium nitride layers, and said second etching gas is one selected from the group consisting of a mixture of $SF_6$ and Ar and a mixture of $SF_6$ and $N_2$ when said first and said second conductive layers are titanium tungsten layers.

* * * * *

UNITED STATES PATENT AND TRADEMARK OFFICE
CERTIFICATE OF CORRECTION

PATENT NO. : 5,629,235
DATED : May 13, 1997
INVENTOR(S) : Min-Sea Liu

It is certified that error appears in the above-indentified patent and that said Letters Patent is hereby corrected as shown below:

Column 8, (claim 13) line 3, "said silicon substrate is an n-type substrate with a p-well" should read --said buries contact region is above said p-well--;
    (claim 32) line 64, "5-1500Å "should read --5~1500Å--;
    (claim 33) line 66, "600°-700°" should read --600°~700°--;
and line 67, "1500-4000Å" should read --1500~4000Å--.

Column 9, (claim 34) line 34, "800°-1100°" should read --800°~1100°--.

Signed and Sealed this

Second Day of December, 1997

Attest:

BRUCE LEHMAN

*Attesting Officer*    *Commissioner of Patents and Trademarks*